United States Patent [19]

Morrow et al.

[11] 4,142,150
[45] Feb. 27, 1979

[54] HIGH-SPEED MEASUREMENT OF $I_{CEO}$ IN TRANSISTORS AND OPTO-ISOLATORS

[75] Inventors: Richard H. Morrow; Grant F. Stetzler, both of Temple, Pa.

[73] Assignee: Western Electric Company, Inc., New York, N.Y.

[21] Appl. No.: 810,468

[22] Filed: Jun. 27, 1977

[51] Int. Cl.² .......................................... G01R 31/22
[52] U.S. Cl. ............................................ 324/158 T
[58] Field of Search ................. 324/158 T, 111, 102, 324/158 D, 158 R

[56] References Cited
PUBLICATIONS

Todd, C. D.; "Simple Tests for Semiconductors"; Electronics World, Dec. 1963, pp. 36-38.

Primary Examiner—Rudolph V. Rolinec
Assistant Examiner—Ernest F. Karlsen
Attorney, Agent, or Firm—R. Y. Peters

[57] ABSTRACT

In testing transistor devices, measurements of the collector-emitter leakage current of the devices with the base open (i.e., $I_{CEO}$) generally require long measuring intervals. This is due to the necessity of charging the Miller Capacitance of the device under test prior to taking the measurement. While the Miller Capacitance is charging, a small base current flows which makes an accurate reading of the $I_{CEO}$ very difficult. To shorten these measurement times, a voltage is applied to the base of the device to increase the charging rate of the Miller Capacitance. After a predetermined time, the voltage is disconnected thereby opening the base of the transistor device. The $I_{CEO}$ reading is then taken at the emitter of the device after it has stabilized to an approximate level of $I_{CEO}$. As an alternative to the application of a voltage to the base, a feedback circuit is connected between the emitter and the base of the test device to provide an automatically adjusted driving current to the base. This sets the emitter current at a desired level and rapidly charges the Miller Capacitance. If the desired emitter current is set at the level of maximum allowable $I_{CEO}$, a go-no go reading of the device can be very rapidly made after the base is open by determining whether the $I_{CEO}$ is increasing or decreasing from the present level.

17 Claims, 3 Drawing Figures

HIGH-SPEED MEASUREMENT OF $I_{CEO}$ IN TRANSISTORS AND OPTO-ISOLATORS

BACKGROUND OF THE INVENTION

1. Field of the Invention

This invention relates generally to methods of and apparatus for testing transistor devices, and more particularly, to methods of and apparatus for measuring the collector-emitter leakage current of transistor devices with the base open (i.e., $I_{CEO}$).

2. Description of the Prior Art

In testing transistor devices, measuring $I_{CEO}$ has heretofore presented a problem due to the generally long measuring times required. In making the test, a D.C. voltage has been placed on the collector of the transistor device while the base of the device is open. Because of the Miller Capacitance between the base and collector junctions of the device, current will flow through the base until the Miller Capacitance is charged. While this charging current is flowing, measurement of the $I_{CEO}$ will be inaccurate.

This problem becomes particularly troublesome in transistor devices having high gains, for example Darlington pairs and opto-isolators using Darlington pairs for their amplifier portion. This is because the Miller Capacitance is equal to the collector-base capacitance multiplied by the transistor device gain. Depending upon the particular characteristics of the transistor device under test, times for measuring $I_{CEO}$ using the prior art techniques can range from 1 to 12 seconds. As a result, either adequate time must be allowed for the long test periods or sampling the devices must be resorted to rather than 100% testing.

SUMMARY OF THE INVENTION

It is, therefore an object of the present invention to provide new and improved methods of and apparatus for testing $I_{CEO}$ in transistor devices.

Another object of the present invention is to provide new and improved methods of and apparatus for rapidly charging the Miller Capacitance of transistor devices to shorten the test times for measuring $I_{CEO}$.

With these and other objects in view, the present invention contemplates new methods of and apparatus for applying a D.C. voltage to the base of the transistor device under test to increase the charging rate of the Miller Capacitance. After a predetermined time, the voltage to the base is disconnected. The $I_{CEO}$ is then measured at the emitter after time has been allowed for the $I_{CEO}$ to stabilize to an approximate level.

As an alternative to provide even faster measuring, a driving current is provided from the emitter to the base of the transistor device via a feedback circuit. After a time sufficient to charge the Miller Capacitance, the feedback circuit is disconnected and the $I_{CEO}$ is measured.

BRIEF DESCRIPTION OF THE DRAWINGS

Other objects and advantages of the present invention may be more clearly understood by reference to the following detailed description and drawings wherein.

DETAILED DESCRIPTION

D.C. Voltage Charging Circuit

Figure 1:
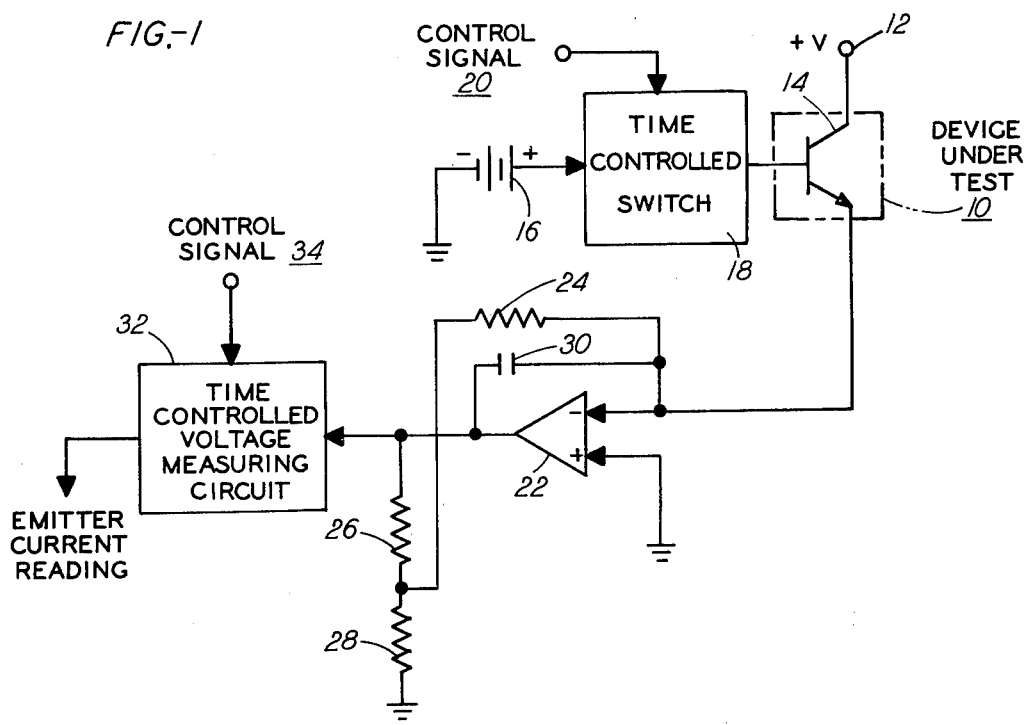
FIG. 1 is a partial schematic and partial block diagram, showing a voltage applied to the base of a transistor device to charge the Miller Capacitance according to the present invention.

Referring now to the drawings and in particular to FIG. 1, a transistor device under test, designated generally by the numeral 10, is shown having a positive D.C. biasing voltage +V coupled to its collector via a terminal 12. For purposes of illustration the transistor device 10 is shown as a single transistor 14, but the invention is equally applicable to compound transistor devices having external terminals corresponding to the base, emitter, and collector of a single transistor.

A D.C. voltage source 16 is coupled to the base of the transistor 14 via a time-controlled switch 18. To control the opening and closing of the switch 18, a control signal 20 is applied to the switch. The emitter of the transistor 14 is coupled to the negative input terminal of a first differential amplifier 22, the positive input of said first differential amplifier being coupled to ground. Resistor 24, 26 and 28 are connected between the negative input to the first differential amplifier 22 and its output to enable the differential amplifier to act as a current to voltage converter. A capacitor 30 is also connected between the negative input and the output of the first differential amplifier 22 to prevent oscillations of the amplifier. The voltage input to the first differential amplifier 22 is coupled to a time-controlled, voltage-measuring circuit 32 which is controlled by a signal 34. To give an output reading indicative of the emitter current level of transistor device 10 under test, the time-controlled voltage measuring circuit 32 is scaled to equate the voltage to an equivalent current.

In operation, power is supplied to the device 10 under test by applying a positive voltage +V to the collector via terminal 12. Due to the necessity of charging the Miller Capacitance between the base and the collector terminals of the transistor device 10 under test, the application of the positive voltage at terminal 12 causes a small current to begin flowing through the device. To substantially increase the charging rate of the Miller Capacitance, the time-controlled switch 18 connects the D.C. voltage source 16 to the base of the transistor device 10 under test. Typically, the D.C. voltage source is a low voltage, for example, 0.45 volts for a single transistor such as transistor 14, or 0.85 volts for a Darlington transistor combination. After a predetermined time which is estimated to charge a substantial portion of the Miller Capacitance, the control signal to the time-controlled switch 18 causes the switch to disconnect the D.C. voltage source 16 from the base. After another predetermined period of time sufficient for the transistor device 10 under test to stabilize to its operating level, the $I_{CEO}$ is read by the time controlled voltage measuring circuit 32.

It should be noted that due to the individual characteristics of each transistor device tested, the exact level of emitter current will vary at the time of opening the base. Also, the exact degree of charging of the Miller Capacitance will vary. Thus, for example, if the maximum allowable $I_{CEO}$ of a device is 60 nanoamps, the emitter current brought about by the voltage drive on the base may be substantially above or below this at the time of opening the base. This, then, requires that a sufficient period of time be left after disconnection of the base to allow the device to reach its approximate level of $I_{CEO}$ before reading can taken. Typically, after a charging time of 50 milliseconds, 300 to 400 milliseconds must be allowed for the device to seek its approximate $I_{CEO}$.

Emitter Current Feedback Charging Circuit

Figure 2:
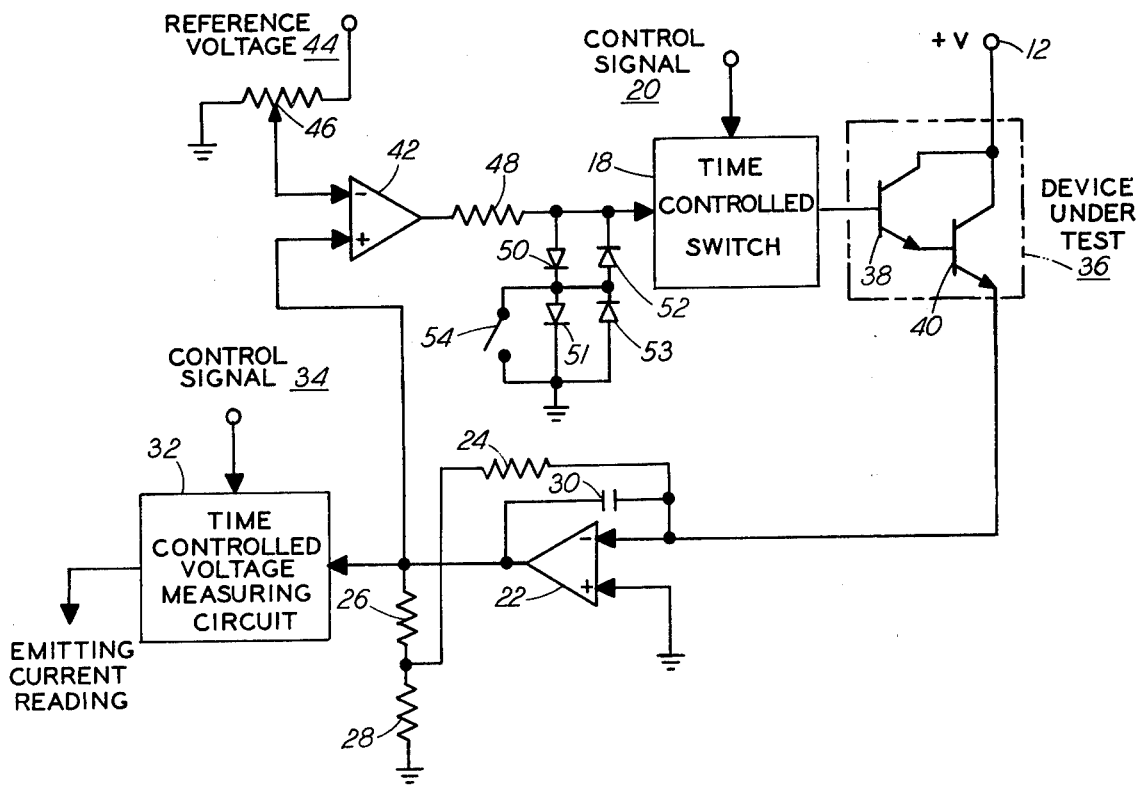
FIG. 2 is a partial schematic and partial block diagram, showing a second embodiment using a feedback circuit to provide a driving current to the base of a transistor device to charge the Miller Capacitance according to the invention.

Referring now to FIG. 2, a second embodiment of the invention is shown using a feedback circuit coupled between the emitter and the base of a transistor device under test, designated generally by the numeral 36. For purposes of illustration, the device 36 under test is shown as being a Darlington amplifier comprising transistors 38 and 40. The differential amplifier 22 and the time-controlled voltage measuring circuit 32 along with their associated elements are identical in structure and function with those shown in FIG. 1. In addition to being coupled to the time-controlled, voltage-measuring circuit 32, however, the output of the first differential amplifier 22 is also coupled to the positive input of a second differential amplifier 42, the negative input of which is coupled to a reference voltage 44. A variable resistor 46 provides for adjusting the magnitude of the reference voltage 44. The second differential amplifier 42 serves as a comparator between the reference voltage 44 and the voltage output of the differential amplifier 22. The voltage output of the second differential amplifier becomes a current by virtue of passing through a resistor 48. This current, in turn, is applied to the base of the transistor device 36 under test via the time-controlled switch 18.

To prevent the output of the second differential amplifier 42 from rising rapidly when the time-controlled switch 18 is open, a clamping circuit comprising diodes 50, 51, 52 and 53 is coupled from the output of the resistor 48 to ground. A shunt switch 54 is connected across diodes 51 and 53 in order to short them out of the circuit. This allows tailoring of the clamping voltage to the input voltage of the particular device 36 under test.

The operation of the circuit of FIG. 2 is similar to that of FIG. 1 in regard to the steps of applying a voltage +V to the collector of the device under test 36 and then monitoring the emitter current with the first differential amplifier 22 and the time-controlled voltage measuring circuit 32. However, the circuit differs from that of FIG. 1 by providing for the application of the feedback driving current to the base of the transistor device 36 under test. Basically, the reference voltage 44 is set to be equivalent to the maximum allowable $I_{CEO}$ for the device 36 under test. The second differential amplifier 42 will continuously compare the emitter current of the device 36 under test by comparing the reference voltage 44 with the voltage output of the first differential amplifier 42. Driving current to the base of the transistor device 36 under the test will then be increased or decreased by the second differential amplifier 42 in accordance with whether the voltage from the first differential amplifier 22 is less than or greater than the reference voltage, respectively. This continual balancing of the emitter current level against the maximum allowable $I_{CEO}$ quickly allows the driving current to the device 36 under test to reach the optimum point for rapid charging of the Miller Capacitance at that particular emitter current level. For a typical device, complete charging of the Miller Capacitance can be obtained in 30 milliseconds or less.

Once the base of the device is opened, the determination of whether it is good or bad can be made very quickly by noting whether the $I_{CEO}$ has increased or decreased from the maximum level it was driven to. Generally, only 40 milliseconds are required to make such a determination. If exact readings are required, these also can be rapidly made since the devices have been driven to a constant known level and will stabilize relatively rapidly from that point to their actual $I_{CEO}$. Typically, 75 to 150 milliseconds after the base is opened will suffice to allow accurate readings to be taken.

Feedback Current Charging of Opto-Isolators

Figure 3:
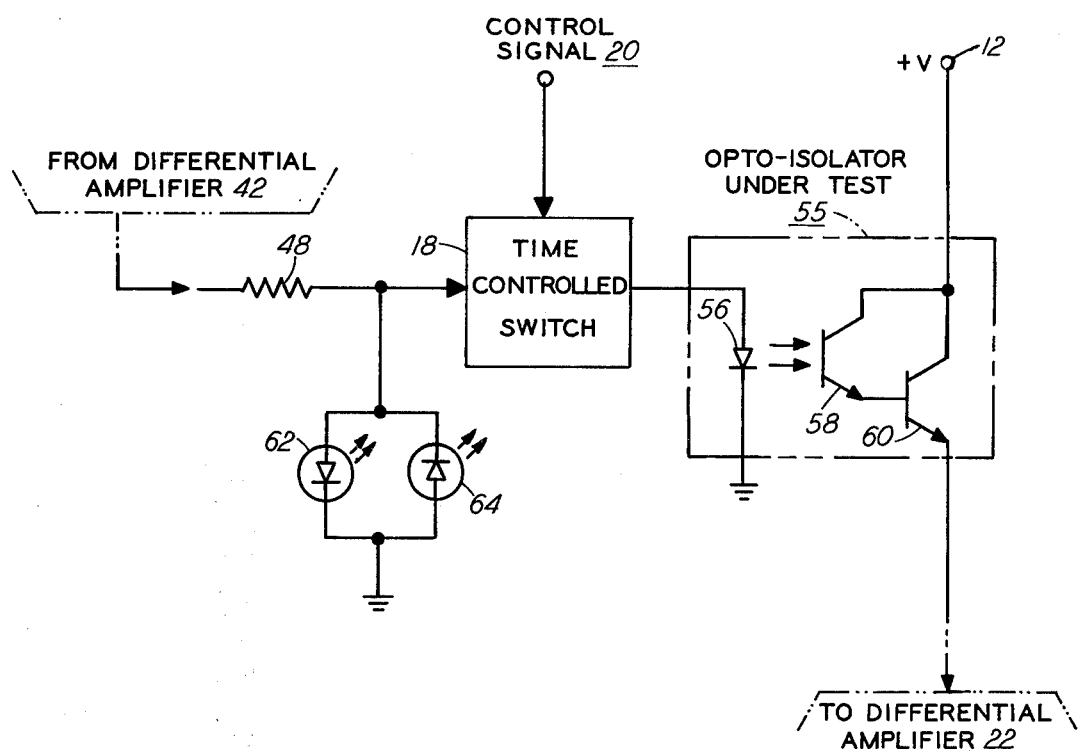
FIG. 3 is a partial schematic and partial block diagram, showing a third embodiment using a feedback circuit to drive an opto-isolator to charge the Miller Capacitance according to the present invention.

FIG. 3 shows a third embodiment used in testing an opto-isolator under test, designated generally by the numeral 55. Although FIG. 3 shows the third embodiment in conjunction with a feedback circuit such as shown in FIG. 2, it should be understood that the voltage driving circuit of FIG. 1 could also be used for testing opto-isolators.

The opto-isolator 55 comprises a light-emitting diode 56 and a Darlington transistor amplifier having a phototransistor 58 and a transistor 60. The base of the phototransistor 58 is "floating" in terms of not having any physical connections. Instead, the base is driven by light emitted from the light-emitting diode 56. Thus, in the operation of charging the Miller Capacitance of the transistors 58 and 60, the driving current is fed to the base of the phototransistors 58 by light emitted from the driven light-emitting diode 56.

In order for the opto-isolator 55 under test to be properly clamped in voltage when the time-controlled switch 18 disconnects the driving feedback current and thereby opens the base of the transistor 58, a clamping circuit is used comprising light-emitting diodes 62 and 64 coupled in parallel with opposite polarities. The use of the light-emitting diodes 62 and 64 achieves the best match of the clamping voltage to the voltage on the opto-isolator light-emitting diode 56 at the time the base is opened.

Although the various transistor devices under test have been shown to be either single transistors, combinations of transistors, or opto-isolators, the present invention can also find use with any semiconductor devices subject to the buildup of a Miller Capacitance between its equivalents of the base and the collector junctions. For example, field effect transistors (FET's), can also be subject to the same difficulties and could be benefited by use of the circuitry of this invention. Also, PNP transistors can be tested using the system as an alternative to the NPN transistors shown. Such testing of PNP transistors would require applying a −V collector rather than the +V shown. And a minus reference voltage would have to be used in the FIG. 2 embodiment.

Similarly, the various voltage inputs to the circuit, including the reference voltage 44 and the D.C. voltage 16, can be provided by any known voltage source. Generally, in the operation of the test set these voltages will be applied in accordance with a test set program. Such test set programs provide control for the entire testing procedure by means of a minicomputer or a microcomputer programmed as to the proper voltages and times of application. Also a hardware programmed sequence could be used.

Time-controlled switch 18 can be any known switch subject to control of its opening and closing in accordance with timed instructions. For example, the switch can be a relay controlled by means of a programmed coil. The program is, of course, generally part of the entire test set program or hardware sequence.

The time-controlled, voltage-measuring circuit 32 should likewise be a circuit which will only make measurements at specified times. This circuit can, for example, simply be a voltmeter scaled to give its output readings in terms of the emitter current. Time control of such a voltmeter can be accomplished by only gating it on at times specified by a control program or hardware sequence.

The timing of the time-controlled switch 18 depends entirely on the necessary times for charging the Miller Capacitance of the device under test. Similarly, the timing of the time-controlled, voltage-measuring circuit 32 depends on the necessary time for allowing the device to either stabilize to its approximate $I_{CEO}$ or, in the case of the feedback circuit, increase or decrease from the level it was driven to after the base is disconnected.

As an example of a typical opto-isolator having a Darlington pair transistor configuration, the feedback current arrangement shows in FIGS. 2 and 3 can charge the Miller Capacitance within 30 milliseconds. Following this 30 milliseconds, the base will be opened by a command to the time-controlled switch 18 and an additional 40 milliseconds will be allowed before the time-controlled voltage measurement circuit 32 will be instructed to read the leakage collector emitter current.

Although these times can, as mentioned above, vary significantly between different devices under test, use of the invention will greatly decrease the necessary test time for any of the devices. This decrease results because the invention allows a much more rapid charging of the Miller Capacitance than is possible by merely connecting a voltage to the collector terminal of the particular device. Furthermore, the feedback circuit embodiment significantly reduces the waiting time after the base is open.

It is to be understood that the above-identified arrangements are simply illustrative of the application of the principles of this invention. Numerous other arrangements may be readily devised by those skilled in the art which embody the principles of the invention and fall within its spirit and scope.

What is claimed is:

1. An apparatus for measuring the collector-emitter leakage current of a transistor device when the base is open, wherein the device has a Miller Capacitance equal to the collector-base junction capacitance multiplied by the current gain of the transistor device, comprising:
   means for applying a D.C. voltage between the collector and the emitter of the transistor device to flow a current through the device to charge the Miller Capacitance;
   means responsive to a control signal for applying a D.C. voltage to the base of the transistor device to induce a current to flow through the device to increase the charging rate of the Miller Capacitance;
   means responsive to the control signal for disconnecting the D.C. voltage to open the base after it has been applied for a predetermined time; and
   means coupled to the emitter of the transistor device for measuring the collector-emitter leakage current of the transistor device after a predetermined time sufficient to allow the collector-emitter leakage current to stabilize to an approximate level after the disconnecting means has opened the base.

2. An apparatus for measuring the collector-emitter leakage current of a transistor device when the base is open wherein the transistor device has a Miller Capacitance equal to the collector-base junction capacitance multiplied by the current gain of the transistor device, comprising:
   a feedback circuit coupled between the emitter and the base of the transistor device to supply a driving current from the emitter to the base to charge the Miller Capacitance of the device;
   means for disconnecting the feedback circuit to open the base and to discontinue the supply of the driving current to the base after a predetermined time sufficient to charge the Miller Capacitance; and
   means coupled to the emitter for measuring the collector-emitter leakage current of the transistor device at a predetermined time after the disconnecting means has opened the base.

3. The apparatus of claim 2, wherein the feedback circuit further comprises:
   monitoring means coupled to the emitter to monitor the emitter courrent; and
   means, coupled between the output of the monitoring means and the base of the transistor device, for comparing the emitter current level with a reference current level and automatically adjusting the driving current to the base of the transistor device until the emitter current level equals the reference current level, the predetermined time for disconnecting the feedback circuit being set to allow sufficient time for the equalizing of the emitter current level and the reference current level.

4. The apparatus of claim 3, wherein the reference current level is set at the level of the maximum collector-emitter leakage current allowable for the transistor device, and the measuring time is set at a predetermined time sufficient to indicate whether the collector-emitter leakage current has increased or decreased from said maximum allowable level after the disconnecting means has opened the base of the transistor device.

5. The apparatus of claim 3, wherein the monitoring means comprises a first differential amplifier which converts the emitter current to a first voltage representative of the emitter current level, the reference current level comprises a voltage source preset to represent a desired current level, and the comparator comprises a second differential amplifier coupled to the first voltage and the reference voltage source.

6. The apparatus of claim 5, wherein the measuring means comprises a time-controlled, voltage-measuring circuit coupled to the output of the first differential amplifier to read the first voltage representative of the emitter current level, said voltage-measuring circuit being scaled to provide a voltage output reading which is indicative of the collector-emitter leakage current.

7. The apparatus of claim 3, wherein the disconnecting means comprises a time-controlled switch coupled between the output of the comparator and the base of the transistor device.

8. The apparatus of claim 7 further including a voltage clamping means coupled from a point between the output of the comparator means and the time-controlled switch to ground to prevent the voltage of the comparator means from rising when the time-controlled switch opens the base of the transistor.

9. The apparatus of claim 8, wherein the voltage clamping means comprises one or more diodes, and means for selectively shunting the diodes to adjust the degree of voltage clamping in accordance with the parameters of the transistor device.

10. The apparatus of claim 2, wherein the transistor device is a Darlington transistor amplifier having two or more transistors.

11. The apparatus of claim 2, wherein the transistor device is an opto-isolator comprising:
a light-emitting diode coupled to the output of the feedback circuit; and
a transistor amplifier, having one or more transistors, the input base of said transistor amplifier being driven by the light output of the light-emitting diode.

12. A method for measuring the collector-emitter leakage current of a transistor device when the base is open, wherein the transistor device has a Miller Capacitance equal to the collector-base junction capacitance multiplied by the current gain of the transistor device, comprising:
applying a D.C. voltage between the collector and emitter of the transistor device to charge the Miller Capacitance;
applying a D.C. voltage to the base of the transistor device in response to a control signal to induce a current to flow through the transistor device to increase the charging rate of the Miller Capacitance;
discontinuing the voltage to the base in response to the control signal after a predetermined time; and
measuring the collector-emitter leakage current of the transistor device at the emitter after a predetermined time sufficient to allow the collector-emitter leakage current to to stabilize to an approximate level after the base has been opened.

13. A method for measuring the collector-emitter leakage current of a transistor device when the base is open, wherein the transistor device has a Miller Capacitance equal to the collector-base junction capacitance multiplied by the current gain of the transistor device, comprising:
applying a D.C. voltage between the collector and emitter of the transistor device;
charging the Miller Capacitance of the transistor device with a feedback driving current from the emitter to the base of the transistor device;
discontinuing the feedback driving current to the base after a predetermined time sufficient to charge the Miller Capacitance; and
measuring the collector-emitter leakage current of the transistor device at the emitter at a predetermined time after the base has been opened.

14. The method of claim 13 further comprising:
comparing the emitter current level with a reference current level; and
adjusting the feedback driving current to the base of the transistor device until the emitter current level equals the reference current level.

15. The method of claim 14 further comprising:
setting the reference current level to the maximum collector-emitter leakage current allowable for the transistor device so that the feedback driving current will be adjusted until the emitter current of the transistor device equals the maximum collector-emitter leakage current allowable; and
setting the predetermined time for measuring the collector-emitter leakage current after the base has been opened at a time sufficient to determine whether the leakage current has increased or decreased from said maximum allowable leakage current.

16. The method of claim 13 further comprising:
converting the emitter current to a first voltage representative of the emitter current level;
comparing the first voltage to a reference voltage representative of a desired emitter current level; and
adjusting the feedback driving current to the base of the transistor device until the first voltage equals the reference voltage.

17. The method of claim 13, wherein the transistor device is an opto-isolator comprising a light-emitting diode and a transistor amplifier having one or more transistors, the method further comprising:
driving the light-emitting diode with the feedback driving current so that the diode will emit light; and
driving the base of the transistor amplifier with the light emitted from the light-emitting diode.

* * * * *